United States Patent
Deppe et al.

(10) Patent No.: US 6,859,477 B2
(45) Date of Patent: Feb. 22, 2005

(54) OPTOELECTRONIC AND ELECTRONIC DEVICES BASED ON QUANTUM DOTS HAVING PROXIMITY-PLACED ACCEPTOR IMPURITIES, AND METHODS THEREFOR

(75) Inventors: Dennis G. Deppe, Austin, TX (US); Oleg B. Shchekin, Austin, TX (US)

(73) Assignee: University of Texas, Austin, TX (US)

( * ) Notice: Subject to any disclaimer, the term of this patent is extended or adjusted under 35 U.S.C. 154(b) by 0 days.

(21) Appl. No.: 10/338,509

(22) Filed: Jan. 7, 2003

(65) Prior Publication Data

US 2004/0131097 A1 Jul. 8, 2004

(51) Int. Cl.[7] ................................................. H01S 5/00
(52) U.S. Cl. .......................................... 372/45; 372/46
(58) Field of Search .................. 372/43–50; 257/13–14, 257/97–98; 117/89; 359/344

(56) References Cited

U.S. PATENT DOCUMENTS

| | | | | | |
|---|---|---|---|---|---|
| 5,371,379 | A | * | 12/1994 | Narusawa | 257/14 |
| 5,543,354 | A | * | 8/1996 | Richard et al. | 117/89 |
| 5,568,499 | A | * | 10/1996 | Lear | 372/45 |
| 6,294,794 | B1 | * | 9/2001 | Yoshimura et al. | 257/14 |
| 6,590,701 | B2 | * | 7/2003 | Sugawara | 359/344 |

* cited by examiner

*Primary Examiner*—Quyen Leung
(74) *Attorney, Agent, or Firm*—Morgan Lewis & Bockius LLP

(57) ABSTRACT

Solid-state optoelectronic and electronic devices that use semiconductor quantum dots for manipulation of photonic or electronic properties include a semiconductor active region forming a quantum dot heterostructure having a plurality of quantum dot layers each having discrete quantum hole states and a p-type impurity layer formed proximate to at least one of the quantum dot layers to provide excess equilibrium hole charge to occupy at least some of the discrete quantum hole states to improve To and other performance characteristics of quantum dot devices.

25 Claims, 7 Drawing Sheets

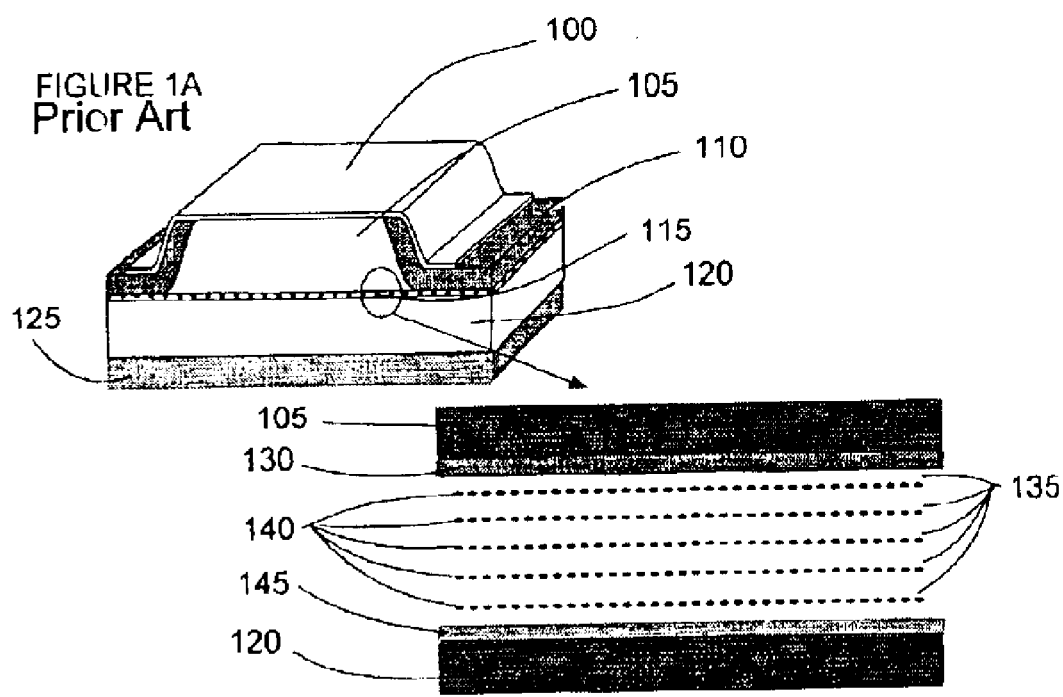

FIGURE 2A
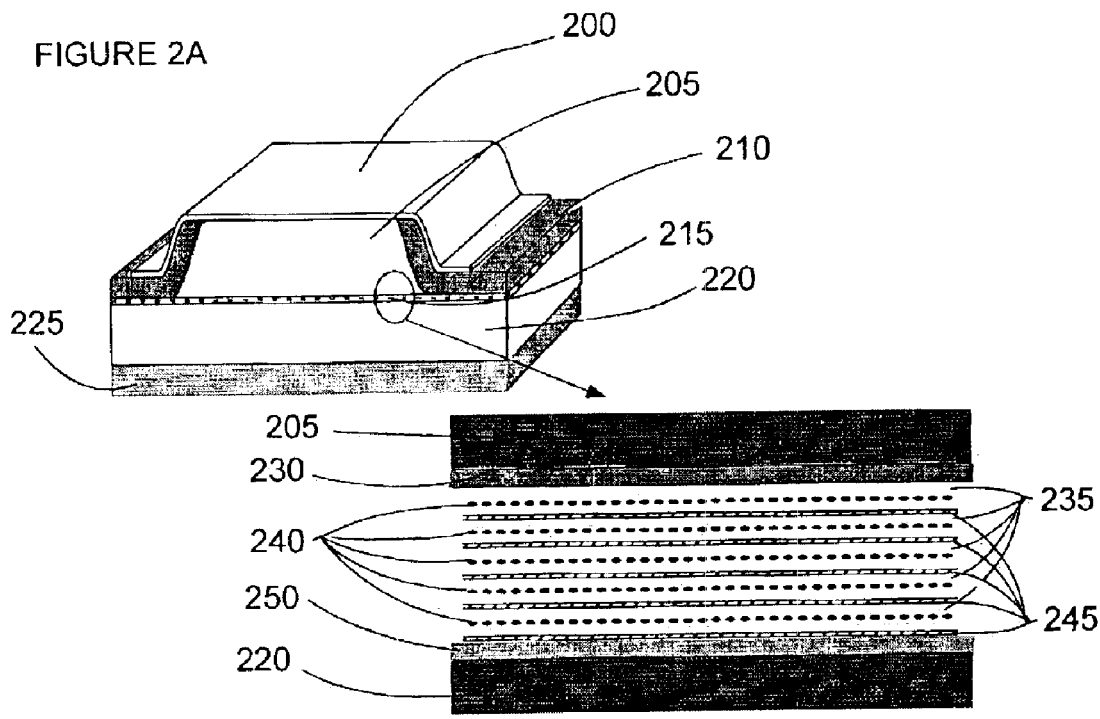
FIGURE 2B
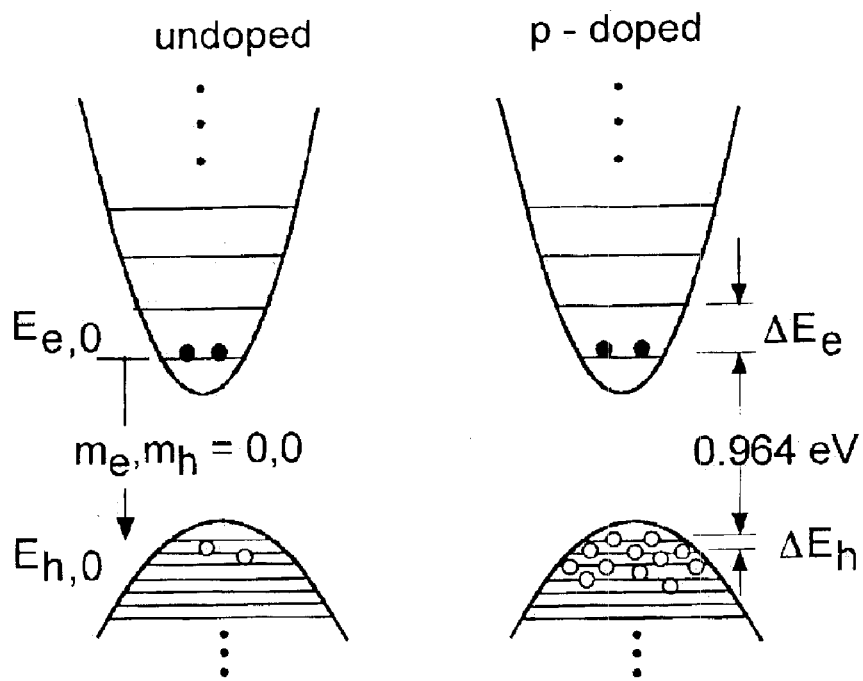
FIGURE 3A  FIGURE 3B
PRIOR ART

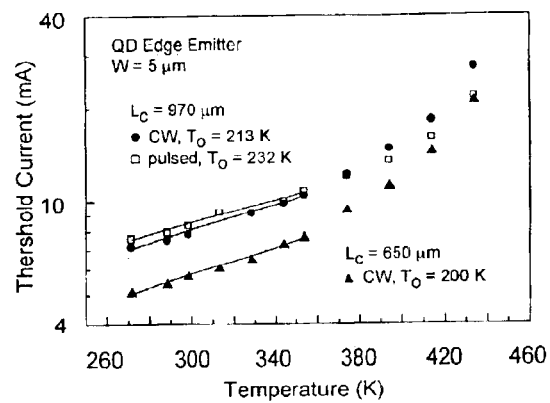
FIGURE 6
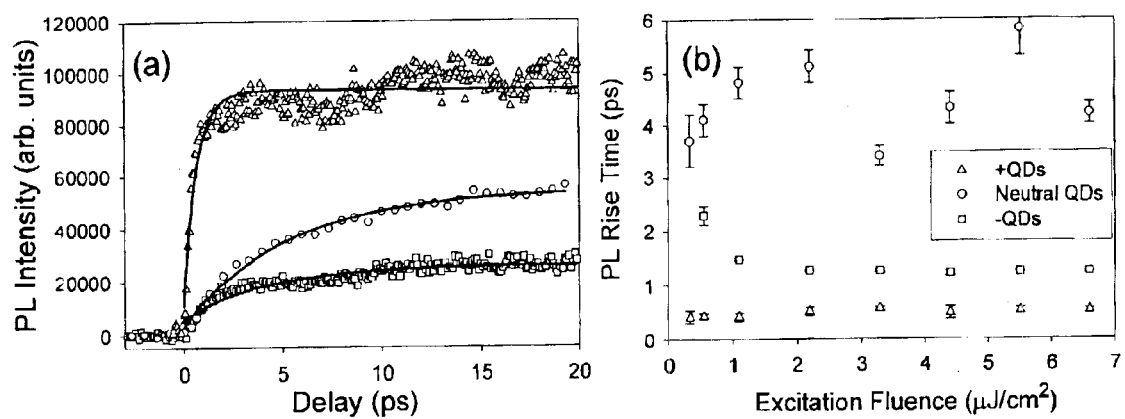
Figure 7A
Figure 7B

OPTOELECTRONIC AND ELECTRONIC DEVICES BASED ON QUANTUM DOTS HAVING PROXIMITY-PLACED ACCEPTOR IMPURITIES, AND METHODS THEREFOR

FIELD OF THE INVENTION

This invention relates generally to solid-state optoelectronic and electronic devices, and more particularly relates to devices that use semiconductor quantum dots for manipulation of photonic or electronic properties.

BACKGROUND OF THE INVENTION

III–V semiconductor quantum dot active material is of interest for creating optical devices such as lasers, optical amplifiers, switches, or spontaneous light emitters. Many applications exist in optical communications for these types of devices to generate, amplify, or switch high speed optical signals. Semiconductor light emitters are also of interest for other applications, such as a high power optical source for fiber amplifiers or solid state lasers, or for pattern reading such as in bar code scanners or compact disk data storage. Semiconductor devices are also of interest for solid-state lighting applications, for example, to replace incandescent or fluorescent lighting. All these applications could presumably be based on semiconductor devices that use quantum dots as the active material for generation or manipulation of light.

Fiber optic communication, in particular, relies heavily on semiconductor lasers to generate light signals, and amplifiers to increase the level of these signals. In lower cost applications it is desirable to have sources and amplifiers that operate without external cooling, and can therefore maintain stable operation over a temperature range that typically may span 0 to 85° C. Present commercial laser technology based on planar quantum well InP-based materials suffer from a strong temperature sensitivity in operating characteristics, which leads to difficulty in obtaining good performance over this temperature range.

In addition, laser sources that exhibit reduced lasing spectral linewidths are also of interest for fiber optic communications, as well as many other applications, because a reduced linewidth generally allows a longer fiber transmission distance, and reduced sensitivity of the laser operation to unwanted extraneous signals or internal operating characteristics. The semiconductor laser's linewidth is related to its alpha parameter, which also sets the laser's chirp characteristics (wavelength change) under direct modulation. Again, commercial InP-based planar quantum well lasers suffer from undesirable chirp characteristics that lead to a larger than desirable lasing linewidth, and a larger than desirable wavelength chirp under direct modulation.

Single wavelength lasers such as distributed feedback lasers, distributed Bragg reflector lasers, and vertical-cavity surface-emitting lasers are also important sources for 1.3 and 1.55 $\mu$m wavelength transmission down single mode fibers. There is a growing need for single wavelength lasers at these wavelengths that can operate uncooled. However, InP-based planar quantum well single wavelength laser technology also suffers from poor operation at the higher temperatures of about 85° C.

High power lasers also suffer in performance due to a greater than desired linewidth enhancement factor. For high power lasers the alpha parameter leads to changes in the lasing characteristics due to unwanted extraneous reflections and internal changes in the cavity characteristics that may occur at high drive levels. Therefore, it is also highly desirable to reduce the alpha parameter and temperature sensitivity in high power semiconductor lasers.

There has also been an unfilled need for semiconductor optical amplifiers with optical gain characteristics that are stable against temperature changes. However, InP-based planar quantum well optical amplifiers suffer from problems that are similar to InP-based planar quantum well lasers. In addition, existing semiconductor optical amplifiers suffer from serious cross-talk problems when amplifying two signals at different wavelengths. This cross-talk problem, and limitations in the thermal characteristics of the planar quantum well active material, have limited the application of semiconductor optical amplifiers as compared to other amplifier schemes, such as erbium-doped fiber amplifiers.

There is also a need for an active material that confines electrons and holes to small volumes, for use in microcavity and photonic crystal devices. The performance of these types of devices is often dominated by edge effects that results from etch fabrication of the photonic crystal. Electron diffusion then usually limits the performance in prior art photonic crystal and microcavity devices (O. Painter, R. K. Lee, A. Yariv, A. Scherer, J. D. O'Brien, I. Kim and P. D. Dapkus, *Science*, June 1999).

Prior art semiconductor quantum dots are based on three-dimensional heterostructures, with each quantum dot able to confine charge carriers in a small volume with a size along each of the three dimensions that is less than the thermal de Broglie wavelength of the charge carrier. Because of this three-dimensional quantum confinement, each quantum dot heterostructure creates energy spectra for its charge carriers that are discrete levels due to its quantum confined charge carriers. In contrast, bulk or planar quantum well semiconductor materials contain quantum states for their charge carriers that form a continuum of energy levels over a significant energy range with respect to the semiconductors' thermal energy.

Early theoretical studies showed that quantum dots potentially have numerous advantages over more ordinary bulk or planar quantum well heterostructures for the application to semiconductor lasers (M. Asada et al., *IEEE J. Quant. Electron.* 22, 1915 1986; Y. Arakawa and A. Yariv, *IEEE J. Quant. Electron.* 22,1887, 1986; K. Vahala, *IEEE J. Quant. Electron.* 24, 523, 1988). These advantages are due to the optically active discrete energy levels of a quantum dot as contrasted to the continuous distribution of energy levels of bulk or planar quantum well active material. Specifically, quantum dot lasers are theoretically capable of higher modulation speeds, lower threshold current density, reduced temperature sensitivity, smaller spectral linewidths, and reduced wavelength chirp as compared to bulk or planar quantum well heterostructure lasers. In addition, quantum dots may reduce or eliminate the cross talk problem that exists in planar quantum semiconductor optical amplifiers, since quantum dots trap individual excitons and provide some isolation between optical gain at different wavelengths. The quantum dot attributes are potentially important for a wide range of applications based on light emitters, and are especially relevant to those limitations in present commercial lasers for fiber optics that use InP-based planar quantum well active material. Each of the potential attributes of quantum dot lasers results from modification of the continuous range of energy levels of bulk or planar quantum well active materials to the discrete distribution of energy levels for quantum dot active material.

Some researchers, however, have suggested that the quantum dot active material may have a fundamental limitation over bulk and planar quantum well lasers that also stems from its discrete energy levels, in that these discrete levels may cause a slow energy relaxation of electrons between the levels. The cause of the slow energy relaxation of electrons is suggested to occur because the quantum confined electron level energy separations can exceed the maximum phonon energy of the quantum dot and surrounding crystal. Non-conservation of energy in the relaxation of electrons between the discrete levels has then been proposed to lead to the so-called "phonon bottleneck." This suggested phonon bottleneck could in principle eliminate the most important energy relaxation path of electrons from a surrounding heterostructure into the lowest energy quantum dot confined states, due to the limited emission of phonons. The belief that a phonon bottleneck may exist in semiconductor quantum dots has led some researchers to assert that this has also been a limitation in performance of lasers and other devices based on quantum dots (H. Benisty, et al., *Phys. Rev. B* 44, 10, 945, 1991; K. Mukai, et al., *Appl. Phys. Lett.* 68, 3013, 1996; D. Klotzkin et al., *IEEE Phot. Tech. Lett.* 10, 932, 1998; M. Grundmann, *Appl. Phys. Lett.* 77, 4625, 2000).

In 1994 Ledentsov et al. demonstrated a technique to realize InGaAs/GaAs quantum dot lasers based on self-organization of strained layer epitaxy. This technique is now widely practiced in many laboratories to create and study quantum dot lasers and other types of quantum dot photonic devices. In such a device a typically undoped quantum dot heterostructure formed through self-organization of strained layer epitaxy is sandwiched between p- and n-doped regions, from which it collects electrons and holes. Stintz et al. (Stintz et al., U.S. Patent Application 20020114367, Aug. 22, 2002) describe a quantum dot laser device in which an undoped quantum dot heterostructure is inserted into a p-i-n heterostructure, with the quantum dot heterostructure occupying the i (intrinsic) region as illustrated in FIGS. 1A and 1B. FIG. 1A shows a schematic of a p-i-n quantum dot heterostructure laser device, and FIG. 1B shows an expanded view of the devices quantum dot heterostructures active region. This strained layer growth technique to form quantum dot lasers also works in other materials, such as InP/InGaP, InAs/InGaAlAs, and InGaN/GaN.

Referring to FIG. 1A, metal layer 100 makes contact with insulator layer 110, which is provided, to direct current into the channel that forms the laser cavity. Layer 105 is an upper semiconductor cladding layer doped p-type, while layer 115 is a semiconductor quantum dot heterostructures active region. Layer 120 is a lower semiconductor cladding layer doped n-type, and layer 125 is a semiconductor substrate.

Next, referring to expanded view of the quantum dot active region illustrated in FIG. 1B, the active region is comprised of layers 130, 135, 140, and 145. Outermost layers 130 and 145 are semiconductor layers with energy gaps and refractive indices intermediate between the p- and n-type cladding layers 105 and 120. Sandwiched between layers 130 and 145 are layers 135 and 140, wherein layers 135 are semiconductor layers with an energy gap and refractive index intermediate between layers 130 and 145 and the quantum dot active material of layers 140.

The electrons captured from the respective n-region are desired to relax into the lowest energy electron levels of the quantum dots, and the holes captured from the p-region are desired to relax to the highest energy hole levels of the quantum dots, to form an optically active region of inverted level populations, and create optical gain. Charge neutrality in the p-i-n heterostructure requires that the injected electron number in the quantum dots be equal to the injected hole number so as to maintain charge balance. Numerous subsequent studies have shown that these types of p-i-n quantum dot lasers are capable of very low threshold current density, reduced optical chirp during modulation, and extended wavelength of operation within a given material system.

However, a serious drawback of p-i-n quantum dot lasers here-to-fore has been low optical gain and a strong sensitivity of their lasing threshold to temperature, in contradiction to early predictions. The low optical gain causes an increased sensitivity of lasing threshold current to temperature, as well as low power output. The temperature sensitivity of the threshold in semiconductor lasers can be described by the relation $$J_{th}(T)=J_{th}(T')e^{(T-T')/T_0} \qquad (1)$$

where $J_{th}(T)$ is the threshold current density of the quantum dot laser, T and T' are two temperatures of interest, and $T_0$ is a parameter of the laser known as the characteristic temperature that characterizes the threshold current density change between T and T'. A low optical gain that is sensitive to temperature in turn causes a threshold sensitivity of the laser to temperature, which is an undesirable characteristic for uncooled applications. Prior studies have shown that quantum dot lasers suffer from a strong temperature sensitivity especially for temperatures above room temperature. Many studies have attempted to relate these drawbacks of low optical gain to a slow energy relaxation of electrons believed to be due to the phonon bottleneck.

Although prior works describe the quantum dot lasers based on a p-i-n heterostructures, there have also been two studies that investigate the influence of doping the quantum dot active material of Fabry-Perot semiconductor lasers to reduce absorption effects below threshold, and to attempt to overcome the believed phonon bottleneck. Yeh et al. (T N.-T. Yeh, et al. *IEEE Phot. Tech. Leff.*, vol. 12, pp. 1123–1125, 2000) reported a study in which a small number of either donor (n-type) impurity or acceptor (p-type) impurity atoms are placed in InGaAs strain layered quantum dots. The purpose of their reported experiments was to study how decreasing the absorption of the quantum dots impacts the semiconductor laser performance. They found that placing impurity atoms within the quantum dots caused a modified crystal growth behavior. In measurements of the threshold characteristics of the temperature dependence of their lasers they found that either donor or acceptor impurities placed in the InGaAs quantum dots led to inferior temperature dependence of threshold as compared to undoped InGaAs quantum dot lasers of an otherwise similar heterostructures.

SUMMARY OF THE INVENTION

The present invention is directed to semiconductor optoelectronic and electronic devices that use quantum dots and operate with a substantially improved performance over a wide temperature range. The present invention is also directed to semiconductor optoelectronic and electronic devices that use quantum dots and exhibit a reduced alpha factor to improve their spectral, modulation, or high power characteristics. The present invention is also directed to fiber optic transceivers or transmitters that utilize quantum dot lasers, so as to alleviate drive constraints that must account for changes in device operation over a substantial temperature range. Quantum dot devices in accordance with the invention are also of interest for electronics. Further, quantum dot devices according to the invention may also be used for quantum computing as a means for storing or manipulating entangled states of carriers or photons.

It is among the advantages of the present invention to provide a quantum dot device with an improved quantum dot active material that leads to a temperature insensitive optical gain so as to reduce or eliminate the dependence of the laser's or amplifier's operating characteristics on temperature. The present invention leads to a quantum dot laser or semiconductor optical amplifier having a greatly improved $T_0$. Another advantage of the present invention is to provide a quantum dot laser with a reduced alpha parameter, so as to obtain devices with improved high power operation, or superior modulation characteristics, or both.

It is also among the advantages of the present invention to provide a laser based on a quantum dot active material that leads to both temperature insensitive single wavelength emission and a greatly improved $T_0$. While the single wavelength emission is obtained using a distributed feedback, distributed Bragg reflector, or vertical-cavity surface-emitting laser cavity, the greatly improved $T_0$ is obtained with the improved quantum dot active material and the proper design of the alignment between the cavity resonance and the quantum dot peak gain.

Fiber optic transmitters or transceivers that utilize uncooled semiconductor lasers must also provide bias circuitry that adequately adjusts the drive current to the laser to compensate for any changes in device characteristics that may result from temperature changes of the laser device. Yet another object of the present invention is to provide a fiber optic transmitter or transceiver with substantially reduced design constraints in the drive circuitry of the laser.

It is also among the advantages of the present invention to provide a semiconductor optical amplifier based on a quantum dot active material that has a temperature insensitive optical gain and a rapid recovery of the gain following amplification of an optical pulse. This rapid recovery of the optical gain is obtained with the improved quantum dot active material.

Another aspect of the present invention is the discovery that the temperature dependence of the quantum dot laser is controlled by the thermal distribution of holes within the quantum dots confined hole states. This discovery recognizes that electron distributions among the quantum dots' confined levels can be made to be stable against temperature, and to occupy mainly those quantum states desired for optical activity (the electron ground state). The present invention includes the recognition that hole distributions, in contrast, can exhibit substantial changes with variation in temperature and can lead to high occupation of energy levels not desired for optical activity, as well as low occupation in those levels that are desired for optical activity. It is a discovery of the present invention that the result of the strong temperature dependence of the quantum dot confined hole distribution in the prior art is a low optical gain at room and higher temperatures, which in turn leads to strong temperature dependence of the device operating characteristics.

It is another discovery of the present invention that the hole distribution of conventional quantum dots can also strongly influenced by the carrier injection level, which leads to an increase in the quantum dot laser's alpha parameter.

Both the strong temperature dependence and the carrier injection level dependence of the conventional quantum dot's confined holes stem from the quantum dot's closely spaced hole levels. Because the hole levels are spaced closely in energy, excess injected hole charge is easily excited thermally to those states that are undesired for optical activity, thus changing the hole distribution with temperature or injection level.

It is another discovery of the present invention that a method to stabilize the hole distribution against significant changes with temperature or injection level is the creation of a large excess of equilibrium holes in the quantum dot confined hole levels. The large excess of equilibrium holes is created by the incorporation of a sufficient number of acceptor impurities per quantum dot, in close enough proximity to the quantum dots, so that the acceptors lose their holes to the quantum dot confined states. The necessary proximity of the acceptor impurities to the quantum dots is determined by the valence band energy difference between the material containing the impurity layer and the quantum dot hole states. The large number excess of equilibrium holes in the quantum dot states decrease the dependence of the hole population in those quantum states desired for optical activity (usually the hole ground state) influence of any thermal redistribution of holes on the hole occupation by those quantum dot states desired for optical activity, and reduces the relative change of the hole distribution due to change in injection level of excess electrons and holes into the quantum dots.

It is yet another discovery of the present invention that the recovery time of the optical gain in a semiconductor optical amplifier following amplification of an optical pulse can be decreased by the creation of a large excess of equilibrium holes in the quantum dot confined hole levels. This creation of a large excess of equilibrium holes is again accomplished by the incorporation of a sufficient number of acceptor impurities per quantum dot. In this case the recovery time is decreased in the presence of the large excess equilibrium holes by eliminating or reducing the effects of slow hole transport into the quantum dots, so that charge transport is mainly due to more mobile electrons.

A form of the invention is directed generally to semiconductor optoelectronic and electronic devices that use p-n junctions to inject electrons and holes from adjoining regions into a quantum dot heterostructure active material, and where the electrons and holes are subsequently captured by the quantum dots to create optically active material for light emission, light amplification, or lasing, and in which the semiconductor optoelectronic or electronic device must operate over a substantially wide temperature range. While present InP-based planar quantum well lasers exhibit $T_0$'s of between 70 K ~110 K, the present invention provides quantum dot lasers containing excess equilibrium hole charge that can exhibit a $T_0$ that exceeds 150 K. For example, initial studies demonstrate quantum dot lasers containing excess equilibrium hole charge that exhibit a $T_0=232$ K over a temperature range from 0 to 85° C.

In another form of the invention the quantum dot material of a semiconductor device may be rendered optically active by a means other than a p-n junction, such as through optical excitation to create electrons and holes that are subsequently captured by the quantum dot active material. In such a device an excess equilibrium number of holes incorporated into the quantum dots, through the appropriate placement and number of acceptor impurities, again leads to thermal stabilization of the optical emission and amplification, and of the quantum dot optoelectronic or electronic device characteristics.

A form of the invention is also directed generally to semiconductor optoelectronic or electronic devices that use p-n junctions to inject electrons and holes from adjoining regions into a quantum dot heterostructure active material, and where the electrons and holes are subsequently captured by the quantum dots to create optically active material for light emission, light amplification, or lasing, and in which it is desirable that the semiconductor optoelectronic or electronic device operate with a reduced alpha factor in its spectral characteristics so as to obtain a longer fiber optic transmission distance, an improved modulation response, or reduced sensitivity to optical feedback such as in high power operation. The reduced alpha factor of the laser's spectral emission can be accomplished by creation of a large excess concentration of equilibrium of quantum dot confined hole charge to stabilize the quantum dots hole distribution against changes in bias level or intrinsic carrier fluctuations.

Still another form of the invention is useful in applications such as single mode fiber optic communications, where it is desirable to obtain both a lasing wavelength and a threshold characteristic that are insensitive to changes in temperature. For such a case a distributed feedback, distributed Bragg reflector, or vertical cavity surface emitting laser may be used to obtain lasing at a single wavelength that exhibits little change with temperature. However, present InP-based planar quantum well lasers that operate at a single wavelength generally exhibit an increased dependence of their threshold characteristics on temperature. For this application, a quantum dot laser based on the present invention that incorporates a large excess number of equilibrium holes can exhibit even lower temperature sensitivity in its threshold than a Fabry-Perot laser, if the gain peak of the quantum dot laser is blue-shifted with respect to the lasing wavelength at the lower operating temperature by the appropriate amount so as to obtain close spectral tuning in the higher temperature range of operation. In this way the invention provides for a laser that has both very low temperature sensitivity in its threshold current and its lasing wavelength over a wide range of temperature.

Still another form of the invention is useful for a semiconductor optical amplifier that has a fast recovery time. For this application a quantum dot semiconductor optical amplifier based on the present invention that incorporates a large excess number of equilibrium holes can exhibit a faster response than an amplifier based on a prior art p-i-n active region. The faster response in this invention comes from the elimination or reduction of the amplifier's speed on hole transport to the quantum dots.

Still another form of the invention is useful for photonic crystal light sources, in which quantum dots are used to confine electron-hole pairs in small active areas. For this application a quantum dot semiconductor optical amplifier based on the present invention that incorporates a large excess number of equilibrium holes reduce the injected electrons' diffusion lengths so as to eliminate or reduce edge recombination effects.

THE FIGURES

FIG. 1A [PRIOR ART] shows a schematic cross-sectional diagram of a quantum dot heterostructure laser based on a conventional p-i-n doping structure. The quantum dot layers are assumed to be formed using the Stranski-Krastanow growth technique as described in Ledetnsov el al., but may also be realized using other techniques such as etching and regrowth. In FIG. 1A the quantum dots are illustrated as lying in sheets, with five stacks of sheets being used.

FIG. 1B [PRIOR ART] is an enlarged view of the active region of the conventional quantum dot heterostructures of FIG. 1A.

FIG. 2A shows a schematic cross-sectional diagram of a charge-controlled active region quantum dot heterostructure laser in accordance with the present invention, based on a p-n junction with p- (acceptor) doping sheets being placed in the active region adjacent to the quantum dot sheets, so as to capture holes into the quantum dots from the acceptor sheets thereby creating an excess of equilibrium holes in the quantum dot hole states.

FIG. 2B is an enlarged view of the active region of the quantum dot heterostructures of FIG. 2A in accordance with the present invention.

FIG. 3A [PRIOR ART] illustrate schematically a conventional electronic structure due to the discrete quantum states of a quantum dot that makes up a quantum dot active region. More particularly, FIG. 3A illustrates the prior art heterostructure of FIG. 1 wherein a quantum dot placed in an intrinsic (i) region of a p-i-n injection device (or an undoped quantum dot device), so that an average quantum dot will capture equal numbers of electrons and holes.

FIG. 3B illustrates, in accordance with the present invention, the heterostructure of FIG. 2 wherein a quantum dot is placed in a charge-controlled active region with acceptor impurities introduced in sufficiently close proximity to the quantum dots so as to create an excess of quantum dot confined holes, greatly increasing the number of holes residing in the desired quantum dot quantum states for optical transitions.

FIG. 6 shows in graphical form the improved threshold current versus temperature of the charge-controlled quantum dot laser of the present invention, where in an exemplary embodiment the temperature dependence of the threshold is greatly reduced over previous results (as described by its characteristic temperature, To=232 K between 0 and 80° C).

FIGS. 7A and 7B show in graphical form the response that is obtained following pulse excitation of either a prior art undoped quantum dot heterostructure [neutral QD], or a prior art quantum dot heterostructure containing donor impurities [−QD], as compared with the improved response that is obtained following pulse excitation of a quantum dot heterostructure including acceptor impurities [+QD] in accordance with the present invention.

Figure 8:
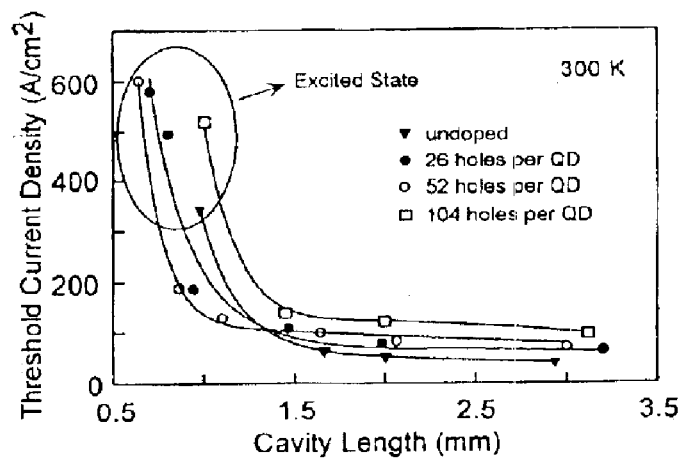

FIG. 8 is a plot showing threshold current density versus cavity length for differently doped, 1.3 $\mu$m quantum dot lasers according to the invention, where the doping levels correspond to 0, 26, 52, and 104 acceptors per quantum dot.

Figure 9:
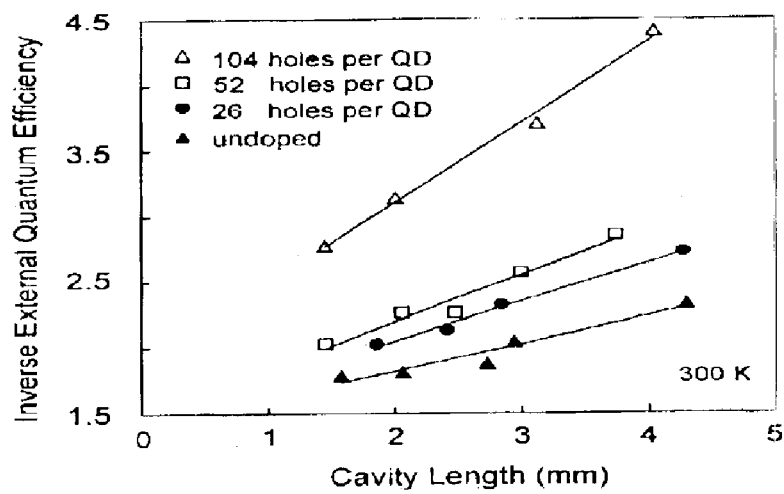

FIG. 9 is a plot of inverse external slope efficiency versus cavity length for the four differently doped quantum dot lasers of FIG. 8.

Figure 10:
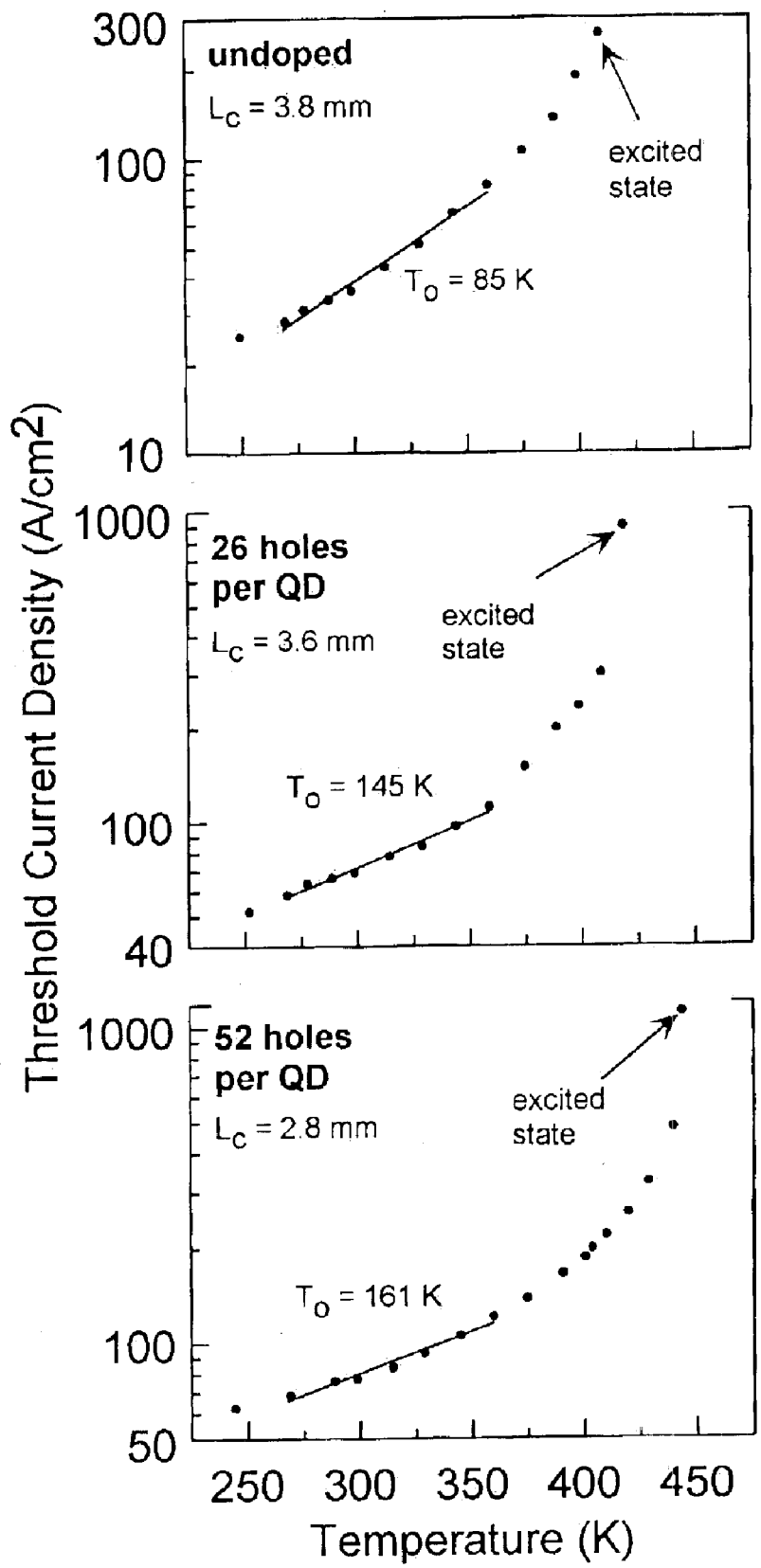

FIG. 10 is a plot of threshold current density versus cavity lengths for the lasers doped with 0, 26, and 52 acceptors per quantum dot, for different cavity lengths, from which it can be seen that the maximum To of 161 K is achieved between 0 and 80° C. for the laser doped with 52 holes per QD, and $L_c$=3.2 mm.

Figure 11:
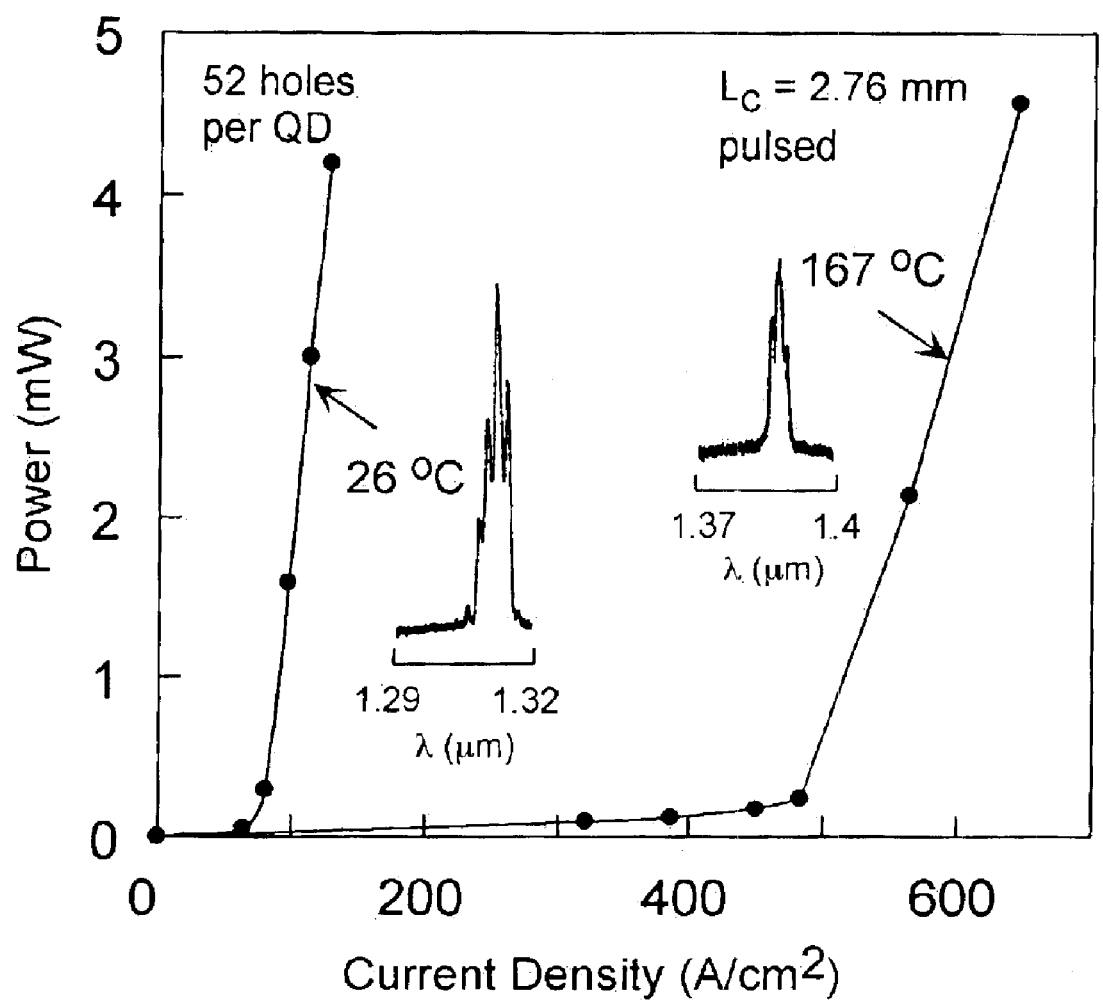

FIG. 11 is a plot of light versus current curves and lasing spectra for the quantum dot laser doped with 52 acceptors per QD and $L_c$=2.76 mm at room temperature and at 167° C.

DETAILED DESCRIPTION OF THE INVENTION

Reference is first made to FIGS. 2A and 2B. FIG. 2A shows in schematic cross-section an exemplary arrangement of the present invention, in which a charge-controlled active region quantum dot heterostructures laser creates an excess of equilibrium holes in the quantum dot hole states. In general, the heterostructure is based on a p-n junction with p- (acceptor) doping sheets being placed in the active region adjacent to the quantum dot sheets, so as to capture holes into the quantum dots from the acceptor sheets. This capturing creates an excess of equilibrium holes in the quantum dot hole states, leading to the desired, improved characteristics.

More particularly, the exemplary arrangement shown in FIGS. 2A–2B relates to a semiconductor optoelectronic or electronic device comprising quantum dot active material in which the distribution of holes occupying the quantum dots is stabilized against changes in temperature and changes in bias level by the creation of a large excess number of equilibrium holes per quantum dot. This is accomplished through the introduction of acceptor impurity atoms in the proximity of the quantum dots. In FIG. 2A, metal layer 200 makes contact with insulator layer 210, which is provided to direct current into the channel that forms the laser cavity. Layer 205 is an upper semiconductor cladding layer doped p-type, while layer 215 is a semiconductor quantum dot heterostructures active region. Layer 220 is a lower semiconductor cladding layer doped n-type, and layer 225 is a semiconductor substrate.

Next, referring particularly to FIG. 2B, which shows an expanded view of the active region of the semiconductor quantum dot heterostructures, the exemplary structure of FIG. 2A may be better appreciated. In particular, the active region is comprised of layers 230, 235, 240, 245, and 250. Outermost layers 230 and 250 are semiconductor layers with energy gaps and refractive indices intermediate between the p- and n-type cladding layers 205 and 220. Sandwiched between layers: 230 and 250 are layers 235 and 240, wherein layers 235 are semiconductor layers with an energy gap and refractive index intermediate between layers 230 and 250 and the quantum dot active material of layers 240. The typical way of forming the quantum dot active material is through strain-driven self-organized growth, so that the quantum dots form during deposition of strained layer epitaxial crystal. Alternatively, etching and regrowth provide another means by which quantum dots may be formed. Embedded in layers 235 are p-doped layers 245 of acceptor impurities in close proximity to the quantum dots, so that a significant number of holes created by the acceptor impurities are captured with the quantum dots to create a large excess equilibrium concentration of quantum dot confined holes.

The method of capturing the holes from the acceptor impurities into the quantum dot states is to place the acceptor impurities layers 245, placed within the barrier layers 235, at a sufficiently short distance from the quantum dots such that the built-in potential between the acceptor impurity layers 245 and quantum dot layers 240 that exists due to hole charge transfer to the quantum dots is substantially less than the valence band energy difference between the layers 235 (and 245) and 240. Otherwise the number of holes in the quantum dots relative to the number of holes that remain in the impurity doped layer may not be large.

Ideally, all holes from the impurity doped layers 245 would be captured in the quantum dot layers 235. However, for the system of InAs quantum dots forming layers 240 and GaAs forming layers 235 and 245, the valence band energy difference between the InAs and GaAs may be as small as 50 meV (see for example, W. Sheng and J.-P. Leburton, Appl. Phys. Leff., vol. 80, 2755, 2002.) This small energy offset may limit the fraction of the holes created by the impurity layer that are captured in the quantum dots. The capture efficiency in this case can be increased by replacing the GaAs materials in layers 235 and 245 with AlGaAs to increase the valence band off-set energy, or increase the confinement of holes to the quantum dot layers 240.

The equilibrium built-in voltage due to the charge transfer is approximated by $$V_{bi} = q \frac{N_{QD} N_h d}{\varepsilon A} \tag{2}$$

where A is the active area of the device, $\varepsilon$ is the dielectric constant of layers 235 and 245, q is the electronic charge, $N_{QD}$ is the number of quantum dots in one of the layers 240, $N_h$ is the number of holes in a quantum dot, and d is the separation between the quantum dot layer of 240 and the closest impurity layer 245. We can evaluate the conditions for which nearly all the holes from the impurities in layer 245 are transferred to the quantum dot layers 240. For the InAs/GaAs quantum dot system, if we assume that a valence band offset of 50 meV exists between the InAs quantum dot layers 240 and the GaAs impurity layers 245, this band offset also limits the built-in voltage that can be obtained due to charge transfer. If we assume the built-in voltage can only become as large as the band-offset, then with d=100 Å, $\varepsilon=13.2\times8.85\times10^{-14}$ F/cm, and $N_{QD}/A=3\times10^{10}$ cm$^{-2}$, the number of holes transferred to the quantum dots starts to become limited by $V_{offset}$ at $V_{bi}\sim V_{offset}$, or at ~12 excess holes per quantum dot. Using AlGaAs instead in layers 235 and 245 to increase $V_{offset}$ will increase the fraction of holes transferred to the quantum dot layers 240, and increase the total number of holes able to be captured by the quantum dots.

Referring next to FIGS. 3A and 3B, FIG. 3A shows a prior art neutral quantum dot (undoped) for the case of a quantum dot designed to emit at ~1.3 μm wavelength. In contrast, FIG. 3B shows a schematic illustration of the energy levels of a quantum dot according to the present invention, with the desired occupation of the quantum dot hole levels through creation of a large number of excess equilibrium holes in the quantum dot (p-doped). In the p-doped quantum dot of FIG. 3B, charge neutrality is maintained between equilibrium holes, excess injected holes, excess injected electrons, and proximity placed acceptor impurities that become charged when losing their holes to the quantum dot. In the prior art undoped quantum dot of FIG. 3A, charge neutrality is maintained between electrons and holes injected into the quantum dot, so that on average electrons and holes occupy the quantum dot in equal numbers. In the p-doped quantum dot of the present invention shown in FIG. 3B, the number of holes in the quantum dot greatly exceeds the number of electrons.

To understand the quasi-equilibrium distribution of charge carriers confined to quantum dots, assume that the charge carriers are distributed among the quantum dots' discrete electron and hole states according to quasi-equilibrium statistics as described by Fermi distributions. The distribution of the quantum dot electronic states are assumed to follow approximately those expected for parabolic confinement potentials, with energy spacings taken from theoretical works of strained layer quantum dots.

Using these assumptions, the optical gain of a quantum dot heterostructure can be taken from the derivation of Deppe et al. (Deppe et al., IEEE J. Quant. Electron. 38, 1587, 2002), and given by $$g_o(N_e) = \sqrt{\frac{\ln(2)}{\pi}} \frac{c\lambda_0^2 \Gamma_0}{2n^3 v_g \Delta\omega \Delta z} \frac{N_{st} N_{QD}}{A_{WL}} s_{0_c,0_v} \gamma_{sp,0,0} [f_{0_c}(N_e) - f_{0_v}(N_e)] \quad (3)$$

where $c$ is the speed of light, n is the refractive index in the cavity, $\Delta\omega$ is the inhomogeneous linewidth (full-width at half-maximum), and $\Gamma_0/\Delta z$ is the optical confinement factor normalized by the laser's active thickness, where the Fermi occupation for quantum dot electron state in (3) is given by $$f_{0_c} = \frac{1}{e^{(E_{0_c}-E_{F_c})/(KT)} + 1} \quad (4)$$

and the Fermi occupation of the quantum dot hole state in (3) is given by $$f_{0_v} = \frac{1}{e^{(E_{0_v}-E_{F_v})/(KT)} + 1}, \quad (5)$$

and where $N_e$ is the number of electrons per quantum dot. The probability of occupation of the desired quantum dot levels is therefore described by the electron and hole quasi-Fermi levels, given by $E_{F_c}$ and $E_{F_v}$ respectively. Each electron level of each quantum dot as illustrated in FIG. 3B contributes to the total electron number, and each hole level of each quantum dot as illustrated in FIG. 3B contributes to the total acceptor number. Applying charge neutrality on average to each quantum dot gives $$N_e + N_A^- = N_h \quad (6)$$

where $N_A^-$ is the number of excess charged acceptors introduced per quantum dot and $N_h$ is the number of holes per quantum dot. Equations (4), (5), and (6) are inter-related, through $$N_e + N_A^- = \sum_{m_c=0}^{M_c} \frac{S_{m_c}}{e^{(E_{m_c}-E_{F_c})/(KT)} + 1} + N_A^- = N_h = \sum_{m_v=0}^{M_v} \frac{S_{m_v}}{e^{-(E_{m_v}-E_{F_v})/(KT)} + 1} \quad (7)$$

where $m_c$ is used to label the discrete electron levels and $m_v$ the discrete hole levels in each quantum dot. Equation (7) shows that the balance between $f_{0_c}$ and $f_{0_v}$, or equivalently $E_{F_c}$ and $E_{F_v}$ that set the occupation of the electron and hole levels desired for optical transitions, can be controlled by the introduction of a certain number of charged acceptors in close proximity to the quantum dots that lose their holes to the quantum dots.

One aspect of this invention is the recognition that electrons injected into a quantum dot readily occupy the quantum dot's lowest electron energy level, and therefore readily take part in the desired quantum dot optical transition. By doing so, they have a thermally stable occupation of the lowest energy levels. In contrast, holes injected into quantum dots under the same conditions are less likely to occupy the quantum dot's highest hole energy level, are therefore less likely to take part in the desired quantum dot optical transition, and also have a distribution among the hole levels that is thermally sensitive. The cause for the thermal sensitivity of the holes is their closely spaced energy levels, while electrons have widely spaced energy levels. The closely spaced energy levels of the holes also cause a sensitivity to injection level during laser operation, which causes an increase in the laser's alpha parameter.

It is, therefore, an aspect of this invention to reduce or eliminate this sensitivity of the quantum dot device to its hole distribution by creating a large excess number of quantum dot confined holes. This is achieved by introducing charged acceptor impurities in close proximity to the quantum dots that then flood the quantum dot levels with excess holes. This flooding with excess holes ensures that $E_{F_v}$ occupies a favorable energy position to create a large optical gain in the quantum dot active material, and that the hole occupation of the desired levels remains high despite changes in device temperature. It also ensures that the any additional holes injected into the quantum dots due to an applied bias, including modulation, makes only a small or negligible change to the total quantum dot confined hole distribution.

Figure 4:
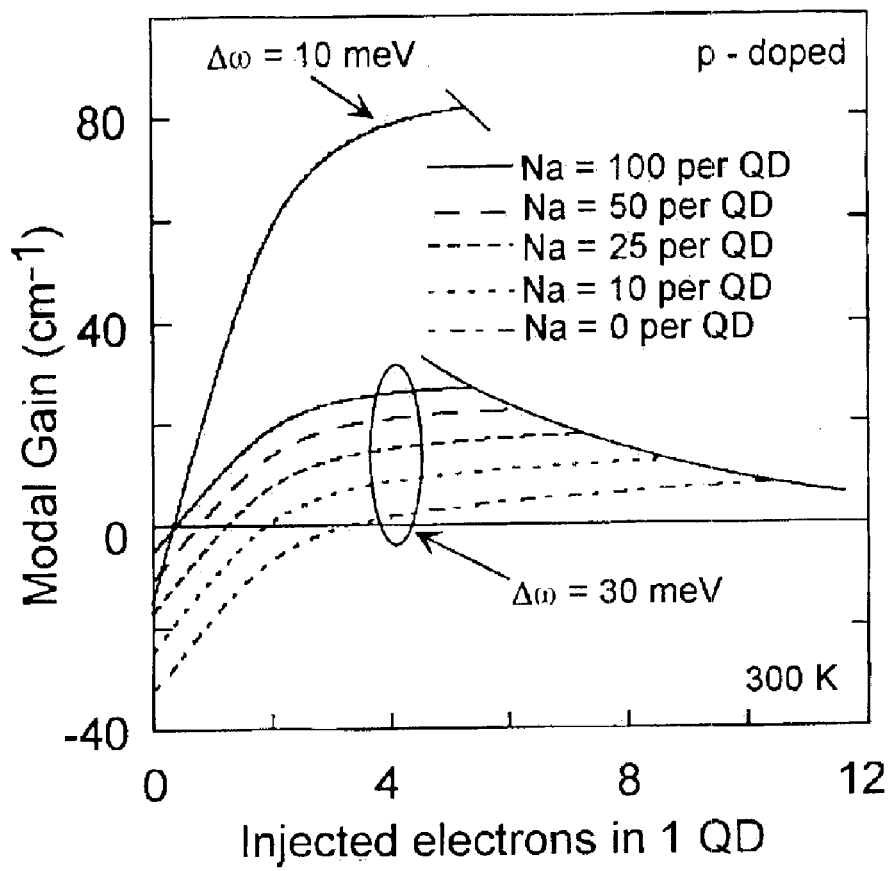
FIG. 4 is a graph showing the influence of charge-control in the quantum dot active region on the optical gain of the active region through the introduction of acceptor impurities in accordance with the present invention, for different hole occupations in the quantum dots.

FIG. 4 illustrates in graphical form the influence on the optical gain of introducing various numbers of charged acceptors per quantum dot in close proximity to the quantum dot active layers so that the quantum dots capture holes created by the acceptor impurities. In prior art quantum dot p-i-n devices, such as the InAs/GaAs device described by Stintz et al. (Stintz et al., U.S. Patent Application 20020114367, Aug. 22, 2002), the quantum dot optical gain cannot be maximized at elevated temperatures due to unfavorable energy distribution of injected holes. Even if the quantum dot density is increased so as to increase the total gain, the laser's modulation speed close to threshold is predominantly limited by the quantum dot laser's differential gain, which remains low, and the hole distribution is sensitive to the external bias level. In contrast, FIG. 4 shows that, in the present invention, the introduction of a significant number of acceptor impurities per quantum dot (with values ranging from 10 to 50 acceptor impurities in FIG. 4), can significantly increase the optical gain and the differential gain as set by the increase in gain per injected electron. In addition, because the gain is no longer limited by an unfavorable quasi-equilibrium distribution of quantum dot confined holes, temperature effects related to the hole distribution are also greatly reduced. Even larger acceptor numbers per quantum dots are beneficial in further increasing the optical gain and differential gain, until the onset of material degradation in the layers containing the acceptor impurities. For example, FIG. 4 shows that improvements in optical gain can be achieved using as many as 100 acceptors per quantum dot, while increasing this number to 200 or more may be necessary for quantum dots with shallow confinement potentials for the holes, or very closely spaced hole levels.

Molecular beam epitaxy has been used to investigate the effect of introducing a significant number of charged acceptor impurities in close proximity to the quantum dot layers of a quantum dot laser. Using molecular beam epitaxy in an exemplary arrangement, a five-stack quantum dot active region is grown at the center of an undoped 0.2 μm thick waveguide with layers 230 and 250 formed from $Al_{0.05}Ga_{0.95}As$, and the n-type lower layer 220 and p-type upper cladding layer 205 formed from $Al_{0.85}Ga_{0.15}As$. The quantum dot active material layers 240 are grown with 200 Å GaAs barriers next to the $Al_{0.05}Ga_{0.95}As$ waveguide layers 230 and 250, and 300 Å of GaAs forming layers 235 that separate each of the five quantum dot layers. Within the GaAs barriers 60 Å thick regions doped with Be are grown 90 Å before each quantum dot layer to form layers 245. The quantum dot layers 240 are formed from a 2.5 monolayer deposition of InAs on the GaAs barriers, and each quantum dot layer is covered with 50 Å of $In_{0.15}Ga_{0.85}As$. From calibration growths, the quantum dot density in each layer is estimated to be $3\times10^{10}$ cm$^{-2}$. The number of acceptor impurities in layers 245 were varied from 10, to 25, to 50 acceptors per quantum dot. The acceptor impurities were formed from layers of GaAs containing Be atoms placed in a doping sheet outside the quantum dots, so that layers 245 are approximately 100 Å away from each quantum dot layer 240. In addition, a standard p-i-n (no close proximity acceptor impurities) quantum dot laser was also fabricated with an otherwise similar heterostructure.

Because $V_{offset}$ between the InAs (quantum dot layers 240) and GaAs layers 235 and 245 may be as small as ~50 meV, it is unlikely that all acceptors lose their holes to the quantum dots. In this case, further improvements may be obtained by replacing the GaAs in layers 235 and 245 with AlGaAs, as long as good material quality is maintained. Although better transfer of hole charge to the quantum dots is possible by using AlGaAs for the doped layers, which can increase $V_{offset}$ to >100 meV, GaAs has been chosen in this case for accurate comparison with past results and to ensure good material quality (high quality GaAs being easier to epitaxially grow than AlGaAs).

The influence of the number of acceptor impurities per quantum dot on the total optical gain was determined by fabricating lasers with different cavity lengths, and therefore different gain lengths, to determine when lasing ceased on the desired quantum dot transitions. Quantum dot lasers containing 25 acceptor impurities per quantum dot exhibited a factor of two increase in maximum optical gain from the lowest energy transition as compared to similar quantum dot lasers that did not contain the acceptor impurities. In addition, quantum dot lasers that contained 25 acceptor impurities per quantum dot exhibited a factor of two increase in the $T_0$.

Figure 5:
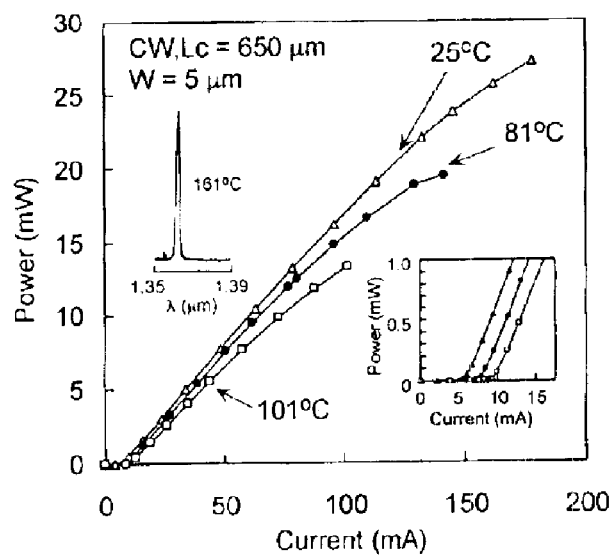
FIG. 5 is a graph showing the light versus current characteristics of a quantum dot laser that uses a charge-controlled active region with 25 acceptors per each quantum dot being placed in a close proximity sheet, such as illustrated in the exemplary embodiment of FIG. 2.

FIG. 5 shows the light versus current curves of an exemplary InAs quantum dot laser grown within an AlGaAs heterostructures of the form shown in FIG. 2. The light versus current curves were measured at different temperatures ranging from 0° C. to 161° C., and lasing was obtained up to temperatures as high as 161° C. FIG. 6 shows a plot of the threshold current density versus temperature. The $T_0$ was evaluated between the temperatures of 0 to 85° C., which is of present commercial interest for applications in uncooled fiber optic transceivers. A $T_0$=232 K was measured for an acceptor impurity level of 25 acceptors per quantum dot. This $T_0$ far exceeds the highest $T_0$'s found for InP devices (~100K for InGaAlAs/InP lasers) over the same temperature range. This exceeds by a factor of two the $T_0$ of undoped quantum dot lasers of similar designs but that do not contain the excess equilibrium holes (no built-in acceptors in the active material).

In another embodiment of the invention, the improved quantum dot active region is placed in a single mode laser cavity, such as a distributed feedback laser, distributed Bragg reflector laser, or vertical-cavity surface-emitting laser. In this case the invention includes the improved quantum dot active region described above and in FIGS. 2A and 2B, combined with a laser cavity design to produce a minimum threshold current density at a given elevated temperature (such as 85° C.). For example, many applications in fiber optics require high temperature operation of single mode lasers at ~85° C. operating at wavelengths of 1.3 μm or 1.55 μm. For such a case the invention can provide even less temperature sensitivity in its threshold current than the Fabry-Perot by optimizing the performance (spectral tuning between the quantum dot gain peak and cavity resonance) at the highest needed temperature.

In yet another embodiment of the invention the improved quantum dot active region described above and shown in FIGS. 2A and 2B forms the basis of a continuous-wave laser with a very small linewidth enhancement factor. For this case an important application of fiber optics is for a laser that emits a single wavelength with a narrow spectral width, which is then modulated with a second device used as an external modulator of the optical signal. For this type of application the laser's spectral width can be an important parameter to determine the distance the optical signal can be sent through a fiber, before detection or regeneration is required. In this embodiment the incorporation of the quantum dot active region shown in FIGS. 2A and 2B that contains an excess of equilibrium holes experiences smaller fluctuations in the hole distribution, and therefore the optical gain. The reduced gain fluctuations yield a smaller emission linewidth, or smaller alpha factor, than an undoped quantum dot laser.

In yet another embodiment of the invention based on a semiconductor optical amplifier, the improved quantum dot active region described above and shown in FIGS. 2A and 2B is used to amplify or switch an optical signal. In this invention, the gain recovery time is shortened due to the built-in excess of equilibrium hole charge. The physics behind the shortening of the gain recovery time is explained by FIGS. 7A and 7B. FIG. 7A shows the measured luminescence response following excitation of quantum dot heterostructures that contain different types of impurities (donors or acceptors) in the proximity of the quantum dots. FIG. 7B shows the measured rise time versus excitation level for the different types of quantum dot heterostructures. Prior art type of undoped quantum dot heterostructures show the slowest response with rise times of ~4 psec. This time is limited by electron and hole transport to the quantum dots. An aspect of the present invention is that acceptor impurities lead to the shortest rise time, and therefore provide the shortest gain recovery time. The short recovery time is due to the fast electron transport to the quantum dots with a large preexisting number of holes present in the quantum dots prior to excitation by the optical pulse. Based on the discovery of the present invention, donor impurities result in an unfavorable influence on the quantum dot active materials optical gain, and are therefore undesirable for use in an optical amplifier that require both maximum gain and a fast recovery of the optical gain. On the other hand, acceptor impurities placed close to the quantum dots to create both a large optical gain and a fast recovery time lead to a new type of quantum dot semiconductor optical amplifier.

A method of manufacturing the various embodiments of the invention will rely on precise epitaxial growth processes such as molecular beam epitaxy or metal-organic chemical vapor deposition to deposit thin layers of highly strained epitaxy followed or preceded by the acceptor doped barrier layers. The strained layer self-organization generally proceeds according to the Stranski-Krastanow growth mode, producing a wetting layer while forming the quantum dots as shown in layers 240 in FIG. 2B. Strained layer InAs quantum dots formed on GaAs using this approach are useful to produce 1.3 μm lasers on GaAs substrates (Shchekin et al., *Electron. Lett.* 38, 712, 2002). For example, between two and three monolayers of InAs deposited on GaAs with the substrate between 450° C. and 550° C. will reorganize from planar epitaxial growth to island growth, with the islands reaching heights between 20 Å and 100 Å, with diameters of 150 Å to 350 Å. These islands form in a two-dimensional sheet of quantum dots, e.g., layers 240 of FIG. 2B, that allow planar impurity doped layers 245 within only a few hundred angstroms of the quantum dots, or more specifically within the diffusion length of the holes. The exact distance can vary from as little as a few angstroms, with the acceptor impurities typically separated from the quantum dots by the barrier layer in a manner which complies with voltages determined from Equation 2, to the diffusion length of several hundred angstroms. This close proximity in which the impurity atoms can be placed next to the quantum dots leads to efficient transfer of excess holes into the quantum dot states, to create the charge imbalance in the quantum dots illustrated in FIG. 3B.

FIG. 4 shows that adding up to 100 holes per quantum dot can continue to increase the optical gain and differential gain of the charge-controlled InAs/GaAs quantum dot optical material. Significant improvement in optical gain occurs even for 10 holes per quantum dot. By changing the impurity layer composition to AlGaAs to increase the valence band energy offset, even a greater fraction of holes can be captured from the impurity layers, reducing the number of acceptor impurities that must be introduced to create the desired number of holes especially when a large number such as 20 or more holes are to be created in the quantum dots.

The optical gain in InAs/GaAs quantum dot heterostructures can be increased as shown in FIG. 4 by increasing the hole number in the quantum dots to over 100 holes per quantum dot. This large number of holes can lead to absorption at 1.3 $\mu$m wavelength due to the acceptor states in layers 245 in FIG. 2B formed from GaAs. Beyond the number of 100 holes per quantum dot, little further improvement in the optical gain is obtained due to full hole occupation of the quantum dot ground hole states for the exemplary embodiment discussed herein. Both the fraction of holes captured by the quantum dots, as well as a reduction in the absorption due to acceptor impurity states in layers 245, can be obtained by changing part or all of layers 235 and layers 245 to AlGaAs.

This invention also applies to other III–V quantum dot heterostructure materials. Specifically, the quantum dot layers 240 may be formed from InP with layers 235 and 245 formed from InGaP, with other layers lattice matched to GaAs. The invention can also be formed using quantum dot layers 240 formed from InAs and part of layers 235 adjacent to the quantum dots are formed from InGaNAs to lengthen the quantum dot emission to ~1.55 $\mu$m, while other parts of layers 235 and 245 are formed from GaAs or AlGaAs. The quantum dot layers 240 may also be formed from InGaN, with layers 235 and 245 formed from GaN and AlGaN.

Different types of atoms may be used to form the acceptor impurities in layers 245 of FIG. 2B. Be, C, Zn, Mg are possible choices, depending on the crystal growth approach. The acceptor impurity C has the advantage of a high incorporation in AlGaAs relative to GaAs, and a low diffusion rate at the crystal growth temperatures of ~500° C. and above.

Referring next to FIGS. 8 through 11, exemplary arrangements of 1.3 $\mu$m InAs quantum dot lasers that are p-type modulation doped and have high room temperature To's are described. In these exemplary embodiments, the lasers doped with 52 acceptors per quantum dot exhibit To's as high 161 K for the commercially important temperature range between 0 and 80° C. Ground state operation is obtained on p-doped quantum dot lasers for temperatures up to 167° C. These results show that quantum dot lasers can be greatly improved by p-type doping so that their To easily exceeds InP-based lasers for the 1.3 $\mu$m wavelength.

FIGS. 8–11 reflect the results for four separate laser growths that have different doping levels for otherwise similar quantum dot laser designs. For these examples, the quantum dot heterostructures are grown using molecular beam epitaxy. A two-stack active region is grown at the center of an undoped 0.2 $\mu$m thick waveguide of $Al_{0.05}Ga_{0.95}As$, with n-type lower and p-type upper cladding layers of $Al_{0.85}Ga_{0.15}As$. The two-stack quantum dot active material is grown with 200 Å GaAs barriers next to the $Al_{0.05}Ga_{0.95}As$ waveguide layers, and 300 Å of GaAs separating the two quantum dot layers. Within the GaAs barriers of the quantum dot layers, 60 Å thick regions doped with Be are grown 90 Å before each quantum dot layer. The quantum dots are formed from a 2.5 monolayer deposition of InAs on the GaAs barriers, and each layer is covered with 50 Å of $In_{0.15}Ga_{0.85}As$. The quantum dot density in a single layer is measured on calibration growths to be $3 \times 10^{10}$ cm$^{-3}$. The Be doping levels in the 60 Å regions are calibrated for 0 (undoped—prior art for reference), $1.3 \times 10^{18}$, $2.6 \times 10^{18}$, and $5.2 \times 10^{18}$ cm$^{-3}$. The doping levels correspond to 0, 26, 52, and 104 acceptors per QD.

The room temperature ground state energy separation between electrons and holes in the quantum dot active material is 0.958 eV. The measured energy separation between the ground and first excited radiative transition is 88 meV. Calculations suggest that of the 88 meV, 75 to 80 meV comes from the electron level separation and the remainder (8 to 13 meV) comes from the hole level separation. Because of the smaller energy separations, the injected hole distribution will be thermally broadened among the closely spaced hole levels. Charge neutrality dictates that for undoped quantum dots the injected electron-hole concentration must be increased due to the thermal broadening of holes in order to achieve maximum gain from the quantum dot ground state. In fact, because of the greater degeneracy, the gain of the higher energy transition can exceed the ground state gain prior to ground state saturation, and cause the laser to operate on the higher energy transition. By building in an excess hole concentration the effect of the closely spaced hole energy levels can be countered, so that the quantum dots' ground state transition is always filled by holes. The temperature dependence of gain is then set predominantly by the electron energy levels, which are widely spaced in energy.

Various length broad area cleaved lasers are fabricated by etching 27 $\mu$m wide ridges which are metalized with Cr and Au, with In used for the n-side metalization. The laser facets are left uncoated, and the laser operation occurs at 1.3 $\mu$m. Device testing is performed under pulsed operation for a range of temperatures. FIG. 8 shows a plot of the measured threshold current density versus cavity length for the different lasers. The undoped lasers have the lowest threshold current density for cavity lengths longer than 1.5 mm, with 38 A/cm$^2$ obtained for a cavity length of $L_c$=2.9 mm. However, at 1 mm cavity length the ground state gain of the undoped active material is insufficient to obtain lasing, and operation switches to the first excited radiative transition with a jump in threshold current density to 343 A/cm$^2$. In contrast, the lasers doped with either 26 or 52 acceptors per QD operate on the ground state even for cavity lengths of $L_c$=0.9 mm. Only at $L_c$=0.64 mm does the lasing switch to the first excited transition.

The threshold current densities for the p-doped lasers are somewhat higher than the undoped for $L_c$>1.5 mm, but become lower with either 26 or 52 acceptors per QD for shorter $L_c$. The threshold current densities are 64 A/cm² for 26 acceptors per QD and $L_c$=3.2 mm, 70 A/cm² for 52 acceptors per QD and $L_c$=3.0 mm, and 96 A/cm² for 104 acceptors per QD and $L_c$=3.1 mm. For shorter cavities the threshold current densities are 108 A/cm² for 26 acceptors per QD and $L_c$=1.5 mm, 99 A/cm² for 52 acceptors per QD and $L_c$=1.6 mm, and 141 A/cm² for 104 acceptors per QD and $L_c$=1.4 mm.

FIG. 9 shows plots of the inverse of the external slope efficiency versus cavity length for the different lasers. The internal quantum efficiency, Error! Objects cannot be created from editing field codes., and waveguide loss, Error! Objects cannot be created from editing field codes., are extracted from the longer cavity data for which the inverse external efficiencies depend linearly on $L_c$. These values are Error! Objects cannot be created from editing field codes.=0.72 and Error! Objects cannot be created from editing field codes.= 1.8 cm⁻¹ for the undoped laser,Error! Objects cannot be created from editing field codes.=0.69 and Error! Objects cannot be created from editing field codes.=2.5 cm⁻¹ for 26 acceptors per QD,Error! Objects cannot be created from editing field codes.=0.68 and Error! Objects cannot be created from editing field codes.=2.9 cm⁻¹ for 52 acceptors per QD, and Error! Objects cannot be created from editing field codes.=0.53 and Error! Objects cannot be created from editing field codes.=3.9 cm⁻¹ for 104 acceptors per QD. For this particular embodiment, doping the quantum dot active material to 104 accepters per quantum dot appears to reduce the internal efficiency and degrade the laser performance, although increased numbers of acceptors are currently believed to improve performance as temperature increases. When the internal losses are combined with the cavity losses the maximum ground state gains can be extracted from their cavity length dependencies. For the embodiments shown, the maximum ground state gains at 300 K are at minimum 9 cm⁻¹ for the undoped quantum dots, 15 cm⁻¹ for 26 acceptors per quantum dot, 18 cm⁻¹ for 52 acceptors per quantum dot, and 12 cm⁻¹ for 104 acceptors. Considering the data of FIGS. 8 and 9, one can clearly conclude that while p-type doping increases the internal optical loss and decreases the internal efficiency, and therefore increases the threshold gain, the increase in the maximum gain from the quantum dot active region at room temperature and above significantly improves the laser performance for shorter cavities.

FIG. 10 shows the threshold current density versus temperature for the lasers doped with either 0, 26, or 52 acceptors per quantum dot. From this plot it can be deduced that p-doping is important for increasing To. This is understood from the explanation above based on the influence of closely spaced hole levels. As presently understood, the To is sensitive to the cavity length since gain saturation due to thermal excitation ultimately causes the take-off in threshold. FIG. 10 shows that the optimum doping level appears to be ~52 acceptors per quantum dot to maximize To from 0 to 80° C. for the exemplary embodiments described here. The highest To of 161 K from 0 to 80° C. measured for the 2.76 mm laser doped with 52 acceptors per quantum dot is, insofar as applicants are aware, the highest To ever reported for a 1.3 µm laser. Note that the optimum doping level depends on the desired temperature range of operation. At cryogenic temperatures undoped QD lasers may be expected to perform well. For the temperature range from 0 to 80° C. lasers doped p-type with 52 holes per quantum dot give the best performance of the exemplary embodiments described here.

For even higher temperatures higher doping levels appear to be effective in further improving laser performance. FIG. 11 shows that with 52 acceptors per QD, ground state laser operation is obtained up to 167° C. The lasing wavelength shifts from 1.314 µm at 24° C. to 1.388 µm at 167° C. The threshold current density remains reasonably low at 347 A/cm² at 167° C.

Having fully described a preferred embodiment of the invention and various alternatives, those skilled in the art will recognize, given the teachings herein, that numerous alternatives and equivalents exist which do not depart from the invention. It is therefore intended that the invention not be limited by the foregoing description, but only by the appended claims.

We claim:

1. A semiconductor device, comprising:
    a semiconductor active region forming a quantum dot heterostructure having a plurality of quantum dot layers each having discrete quantum hole states, and
    a p-type impurity layer formed in the active region proximate to at least one of the quantum dot layers to provide excess equilibrium hole charge to occupy at least some of the discrete quantum hole states, wherein the p-type impurity layer is selected to provide an amount of excess equilibrium hole charge sufficient to cause an increase in optical gain of the device.

2. The device of claim 1 in which the p-type impurity layer is on the order of 100 angstroms from the proximate quantum dot layer.

3. The device of claim 1 in which the p-type impurity layer is positioned no farther from the quantum dot layer than the diffusion length for holes injected from the p-type impurity layer.

4. The device of claim 1 in which the p-type impurity layer is positioned no closer to the quantum dot layer than permitted by a valence band offset voltage between the p-type impurity layer and the quantum dot layer.

5. The device of claim 1, wherein the quantum dot heterostructure containing excess equilibrium holes is placed in a p-n heterostructure for electrical current excitation.

6. The device of claim 1, wherein the quantum dot heterostructure is placed within a semiconductor photonic crystal.

7. The device of claim 1 wherein the quantum dot heterostructure containing excess holes is the active region of a laser.

8. The device of claim 1 wherein the quantum dot heterostructure containing excess holes in the active region is a semiconductor optical amplifier.

9. The device of claim 1 wherein the ratio of the number of hole acceptor impurities relative to the number of quantum dots is in the range of 5 to 200.

10. The device of claim 1 wherein the ratio of the number of hole acceptor impurities relative to the number of quantum dots is in the range of 10 to 75.

11. The device of claim 1 wherein the ratio of the number of hole acceptor impurities relative to the number of quantum dots is twenty or greater.

12. A method of fabricating a semiconductor light emitting device, comprising the steps of:
    forming in a semiconductor active region a quantum dot heterostructure having a plurality of quantum dot layers, each having discrete quantum hole states, and
    forming in the semiconductor active region, proximate to at least one of the quantum dot layers, a p-type impurity layer to provide excess equilibrium hole charge to occupy at least some of the discrete quantum hole states, wherein the p-type impurity layer is selected to provide an amount of excess equilibrium hole charge sufficient to cause an increase in optical gain of the device.

13. The device of claim 1 wherein the p-type impurity layer is GaAs.

14. The device of claim 1 where in the p-type impurity layer is AlGaAs.

15. The device of claim 1 wherein the semiconductor device is a light emitting device.

16. The device of claim 1 wherein the semiconductor device is a semiconductor optical amplifier.

17. A semiconductor device comprising:

an active region including a quantum dot heterostructure having a plurality of quantum dot layers each having discrete quantum hole states, and a barrier layer substantially adjacent at least one of the plurality of quantum dot layers, a p-type impurity layer formed in the active region proximate to the barrier layer at a distance from the quantum dot layers small enough to provide excess equilibrium hole charge to occupy at least some of the discrete quantum hole states, wherein the p-type impurity layer is selected to provide an amount of excess equilibrium hole charge sufficient to cause an increase in optical gain of the device.

18. A semiconductor device comprising:

an active region including a quantum dot heterostructure having a plurality of quantum dot layers each having discrete quantum hole states, and a barrier layer substantially adjacent at least one of the plurality of quantum dot layers, a p-type impurity layer formed in the active region as part of the barrier layer at a distance from the quantum dot layers small enough to provide excess equilibrium hole charge to occupy at least some of the discrete quantum hole states, wherein the p-type impurity layer is selected to provide an amount of excess equilibrium hole charge sufficient to cause an increase in optical gain of the device.

19. The semiconductor device of claim 17 in which the p-type impurity layer is formed integrally with the barrier layer.

20. The semiconductor device of claim 17, wherein the p-type impurity layer is selected to provide at least 10 acceptor impurities per quantum dot.

21. The semiconductor device of claim 17, wherein the semiconductor device is a semiconductor laser.

22. The semiconductor device of claim 17, wherein the semiconductor device is adapted to provide optical amplification.

23. The semiconductor device of claim 18, wherein the p-type impurity layer is selected to provide at least 10 acceptor impurities per quantum dot.

24. The semiconductor device of claim 18, wherein the semiconductor device is a semiconductor laser.

25. The semiconductor device of claim 18, wherein the semiconductor device is adapted to provide optical amplification.

* * * * *

UNITED STATES PATENT AND TRADEMARK OFFICE
CERTIFICATE OF CORRECTION

| | | |
|---|---|---|
| PATENT NO. | : 6,859,477 B2 | |
| APPLICATION NO. | : 10/338509 | |
| DATED | : February 22, 2005 | |
| INVENTOR(S) | : Dennis G. Deppe et al. | |

It is certified that error appears in the above-identified patent and that said Letters Patent is hereby corrected as shown below:

Col. 1 of the SPECIFICATION, below the TITLE, please add the following paragraph:

--The United States Government has certain rights in this invention under Office of Naval Research Grant Number N00014-01-1-0052.--

Signed and Sealed this

Twenty-third Day of September, 2008

JON W. DUDAS
*Director of the United States Patent and Trademark Office*